US006246295B1

(12) United States Patent
Matsui et al.

(10) Patent No.: US 6,246,295 B1
(45) Date of Patent: Jun. 12, 2001

(54) PLANAR RADIATION OSCILLATOR APPARATUS

(75) Inventors: Toshiaki Matsui, c/o Communications Research Laboratory, Ministry of Posts and Telecommunications, 4-2-1-Nukui-Kitamachi, Koganei, Tokyo (JP); Masami Murata, Tokyo (JP)

(73) Assignees: Communications Research Laboratory, Ministry of Posts and Telecommunications; Toshiaki Matsui, both of Koganei (JP)

( * ) Notice: Subject to any disclaimer, the term of this patent is extended or adjusted under 35 U.S.C. 154(b) by 0 days.

(21) Appl. No.: 09/518,928

(22) Filed: Mar. 3, 2000

(30) Foreign Application Priority Data

Mar. 5, 1999 (JP) ................................................ 11-059070

(51) Int. Cl.$^{7}$ ...................................................... H03B 5/18

(52) U.S. Cl. ................................ 331/99; 331/55; 331/56; 331/96; 331/117 D; 455/129

(58) Field of Search ................................. 331/55, 56, 96, 331/99, 117 D; 455/129

(56) References Cited

U.S. PATENT DOCUMENTS

| | | |
|---|---|---|
| 5,450,040 | 9/1995 | Matsui et al. . |
| 5,581,267 | 12/1996 | Matsui et al. . |
| 5,675,295 * | 10/1997 | Brebels et al. ...................... 331/105 |
| 5,982,245 | 11/1999 | Matsui et al. . |

FOREIGN PATENT DOCUMENTS

| | | |
|---|---|---|
| 51-88187 | 8/1976 | (JP) . |
| 59-15313 | 1/1984 | (JP) . |
| 1-112827 | 5/1989 | (JP) . |
| 11-31918 | 2/1999 | (JP) . |

* cited by examiner

*Primary Examiner*—David Mis
(74) *Attorney, Agent, or Firm*—Oblon, Spivak, McClelland, Maier & Neustadt, P.C.

(57) ABSTRACT

A planar radiating oscillator apparatus for micro- and milliwaves includes a pair of conductor patches disposed with their pointed portions in proximity and their far edges on opposite sides, a high-frequency transistor disposed between and connected to the conductor patches, a conductor planar surface disposed under and parallel to the fan-shaped conductor patches from which it is separated by a distance equal to between one-fifteenth and one-fifth the generated wavelength therefrom, and at least one direct current power source connected to the conductor patches and having a ground potential in common with a source potential of the high-frequency transistor.

7 Claims, 16 Drawing Sheets

PLANAR RADIATION OSCILLATOR APPARATUS

BACKGROUND OF THE INVENTION

1. Field of the Invention

This invention relates to a planar radiating oscillator apparatus for micro- and millimeter waves that integrates electromagnetic wave radiation antenna and high-frequency wave oscillation capabilities, is usable in high-efficiency microwave submillimeter-region telecommunication apparatus and radiometry technologies, and can be used as a spatial power combining type oscillator apparatus for high-power output.

2. Description of the Prior Art

Conventional radio equipment, including radio communication apparatuses and various types of radiometry equipment such as radar systems and radiometers, is configured by combining antenna apparatus technologies and transmitter/receiver technologies related mainly to high-frequency circuitry. Antenna apparatus technologies for efficiently radiating electromagnetic waves and receiving electromagnetic wave signals in accordance with the intended purpose and high-frequency circuit technologies for the transmitters and receivers that handle signal processing and control have long constituted mutually independent fields of technology that meet only in the need to match the antenna input and circuit output impedances.

The telecommunication equipment technology sector is undergoing major changes. Recent advances in semiconductor device technology have led to the development of technologies that make it possible for amplifier, oscillator, multiplier, mixing and other high-frequency circuit element functions to be achieved by integrated planar circuits. These high-frequency integrated circuit technologies are being widely viewed as providing radio communication apparatus technologies of the future that will enable apparatuses whose integrated, planar circuitry makes them simultaneously light, compact, high-performance, highly reliable and low cost. As such, they can be expected to be used in place of the conventional type of system of configuring apparatuses by interconnecting waveguide and coaxial circuit components. This technological environment is creating a need for the development of new micro- and millimeter wave technologies that can integrate the antenna with the integrated circuitry. The progress in semiconductor device technology for high-frequency circuit applications is generating demand for a broad range of technologies. These include technologies able to provide the new device functions needed to configure micro- and millimeter wave mobile communication systems, as well as technologies for providing radiometry control systems with new capabilities such as high-function antenna beam shaping techniques and micro- and millimeter wave imaging techniques.

As frequencies rise in the micro- to millimeter wave region, dielectric loss and conductor loss at the conductor surface increase to pose a major problem in terms of transmission line loss. Arraying planar antennas to enhance antenna gain results in a heavy feeder loss and a large drop in system total performance and efficiency from the connections in the long transmission line of the micro- and millimeter wave radio apparatus. While there is therefore a considerable need to develop a new technology for integrating the antenna and the high-frequency planar circuit, numerous difficult technical problems remain to be solved before this can be done.

In the simplest configuration, with the active circuit and the antenna circuit disposed adjacently on the same plane, it is difficult with high-frequency coupling to realize the desired apparatus functions by the antenna pattern, oscillator frequency, deviation of noise characteristics and the like. While rigorous consideration of spatial intercoupling methods is required in such cases, these are generally complex and, except in special cases, usually difficult to solve by electromagnetic field analysis.

As is clear from the foregoing, in order to realize transmitter technologies able to efficiently effect high-frequency generation and output and impart objective-matched directionality for radiation in the required direction, it is necessary to develop a new method for functionally integrating the oscillator circuit and the antenna with high efficiency. An insufficiently high amplitude of the high-frequency signal to be transmitted to a desired location has conventionally been coped with either by increasing the output of the signal source or by increasing the antenna gain.

A multi-element antenna array with a sharp antenna radiation characteristic can be achieved provided that a signal source can be readily obtained that has sufficiently high output to compensate for the drop in radiation efficiency caused by the feeder loss. However, the fact that millimeter wave semiconductor devices are fabricated using ultrafine processing technologies to provide the fine geometries needed to secure high-frequency characteristics means that the power that individual devices can handle falls sharply with increasing frequency. Thus, finding ways to achieve an adequate output in the millimeter wave region is an important focus of technical research.

FIG. 19 is a view representing the configuration of a conventional high-frequency oscillator apparatus. In this arrangement, a resonator 1 and negative resistance amplifier circuit 2 are coupled by a waveguide 4 and a load 3 is attached to other terminals of the negative resistance amplifier circuit 2 via a waveguide 5. In this configuration, oscillation power is extracted from a port separate from the resonator 1. In this oscillator apparatus configuration, which is used extensively for portable telecommunication devices operating in the microwave and submicrowave frequency ranges, the resonator 1 incorporates a dielectric resonator that is compact and has a high dielectric constant.

In contrast, in the conventional oscillator apparatus configuration illustrated in FIG. 20, the resonator also functions as an electromagnetic wave output section. In this arrangement, a negative resistance amplifier circuit 2 is incorporated inside a resonator 1 and a load 3 represents the amount of additional loss caused by extraction of the oscillation power to the resonator exterior. A typical example of such a configuration is that of a laser oscillator provided with an amplification medium inside its resonator. In this configuration load 3 represents the extraction of the oscillation power in the form of a beam radiating into free space from a partially transparent reflecting mirror surface of the laser resonator.

FIG. 21 is a view illustrating another configuration of a conventional radiating oscillator apparatus in which the resonator also functions as an electromagnetic wave output section. In this arrangement a resonator 1 and negative resistance amplifier circuit 2 are connected by a waveguide 4, and a load 3 represents the amount of additional loss caused by extraction of the oscillation power to the resonator exterior as a beam 5. In one example of such a configuration, one of the present inventors has disclosed a micro- and millimeter wave oscillator apparatus that integrally combines a Gaussian-beam resonator with a negative resistance amplifier circuit (U.S. Pat. No. 5,450,040). In terms of principle, the oscillator apparatus of FIG. 21 is a variation of the configuration of FIG. 20 in which the extraction of the amplification medium to the outside of the resonator is advantageous in terms of the oscillator apparatus technology in that it enables the securing of two parameters that make it possible to control the oscillation conditions.

FIG. 22 illustrates the configuration of a conventional beam output type micro- and millimeter wave oscillator apparatus that is a specific embodiment of the configuration of FIG. 21. Here, the resonator 1 of FIG. 21 is a Fabry-Perot resonator 8 comprised of a spherical, partially transparent reflecting mirror surface 6 and a conductor reflecting mirror surface 7 in which a negative resistance amplifier circuit 2 is connected by a waveguide 4 and a coupling region 9 that constitutes part of the conductor reflecting mirror surface 7 of the resonator 8. The partially transparent reflecting mirror surface 6 may be constituted by a two-dimensional conductive thin-film grid. Either the reflecting mirror surface 6 or the conductor reflecting mirror surface 7 may be constituted as a spherical mirror, whereby the resonator mode forms a Gaussian distribution about the optical axis.

Moreover, to configure the resonator as one that is weakly coupled with free space, the reflectance of the reflecting mirror surface 6 is set to be higher than the reflectance of the conductor reflecting mirror surface 7 so that when viewed from the side with the negative resistance amplifier circuit 2, the resonator 8 appears to be a one terminal device. The interaction between the resonator and the negative resistance amplifier circuit 2 increases the oscillation, increasing the high-frequency wave electric power accumulated inside the resonator and also increasing the power of a beam output 10 leaking out as a Gaussian beam from the partially transparent reflecting mirror surface 6, resulting in a steady state of balance between the gain by the negative resistance amplifier circuit 2 and the total loss, which includes the oscillation output.

In the apparatus of FIG. 22, since the reflectances of the partially transparent reflecting mirror surface 6 and the conductor reflecting mirror 7, i.e., the coupling strength with free space, and the coupling strength with the negative resistance amplifier circuit 2 can be set independently, two basic oscillator apparatus adjustment items, including phase adjustment through combination of the coupling region 9 and the waveguide 4, can be substantially controlled. On the other hand, the Gaussian beam resonator is limited in application by the size of its aperture, which is several wavelengths or more. Moreover, it is by nature a high-Q resonator, and as such is not suitable for applications in which wideband frequency characteristics are required.

FIG. 23 illustrates a conventional oscillator apparatus configuration in which the negative resistance amplifier circuit and the antenna elements are disposed adjacently on the same plane. In FIG. 23, a high-frequency transistor 12 is integrated with a resonator 1 composed of a strip line to constitute an oscillator as a negative resistance amplifier circuit, and direct current power supplied from a direct current bias line 11 is converted to high-frequency power and radiated into free space via an integrally connected square conductor patch 15 antenna. Since coupling of the oscillation between a stub 13, the strip line resonator 1, the direct current bias line 11 and the square conductor patch 15 antenna is hard to avoid, slight differences in impedance matching, resonant frequency, wire location and the like produce complex interactions that critically affect frequency spectrum, power output and radiation pattern, making the oscillator apparatus of FIG. 5 difficult to handle in practice.

FIG. 24 shows an example of a prior art radiating oscillator apparatus disclosed by York et al. in which the planar conductor patches serve as both a resonator and as an electromagnetic wave output section (R. A. York and R. C. Compton, "Quasi-Optical Power Combining Using Mutually Synchronized Oscillator Arrays," IEEE Trans. on Microwave Theory and Tech., Vol. MTT-39, pp. 1000–1009, 1991). This disclosure describes a method of configuring a simple planar radiating oscillator apparatus. This comprises adjacently disposing two rectangular conductor patches 15 each formed as a broad low-impedance microstrip line across a narrow gap 16 connecting the drain and gate of a field effect high-frequency transistor (FET) 12 whose source is grounded one to each of the low-impedance microstrip lines, directly biasing the two low-impedance microstrip lines by direct current bias lines 11, and using the capacitive coupling by the narrow gap 16 as an amplifier positive feedback circuit to constitute a negative resistance amplifier circuit as seen from the side of the resonator in terms of high frequency.

FIG. 25 shows another example of a prior art radiating oscillator apparatus in which the planar conductor patches serve both as a resonator and an electromagnetic wave output section (R. A. Flynt, J. A. Navarro and K. Change, "Low Cost and Compact Active Integrated Antenna Transceiver for System Applications," IEEE Trans. Microwave Theory Tech., Vol. 44, pp. 1642 to 1649, 1996). In this arrangement, semicircular conductor patches 17 are arranged in mutual opposition and a high-frequency FET 12 is disposed at the center to configure a radiating oscillator apparatus whose principle is the same as the example shown in FIG. 24. The two semicircular conductor patches 17 are capacitively coupled by chip capacitors 18 across the gap 16 and a chip resistance 34 provides a connection between the gate and drain, thereby establishing a phase condition for satisfying a negative resistance condition by positive feedback.

FIG. 26 shows another example of a radiating oscillator apparatus configuration in which the planar conductor patches serve as both a resonator and an electromagnetic wave output section (X. D. Resonator 1 and K. Chang, "Novel Active FET Circular Patch Antenna Arrays for Quasi-Optical Power Combining," IEEE Trans. Microwave Theory Tech., Vol. MTT-42, pp. 766 to 771, May 1994). In principle, this apparatus comprised by two circular conductor patches 17 placed in proximity with a high-frequency FET 12 therebetween is similar to that of the radiating oscillator apparatus of FIG. 24, with the circular conductor patches 17 forming a resonator. Other than the ability to adjust the distance of separation between the conductor patches and the conductor planar surface disposed under and parallel to the conductor patches, the configuration offers no freedom in terms of the ability to adjust the parameters of the radiating oscillator apparatus.

In order to build up oscillation and accumulate electromagnetic wave energy in the resonator, the feedback to the field effect transistor gate side has to be conducted at an appropriate phase and ratio. When the combination of feedback phase and amplitude meets the condition required of a negative resistance amplifier circuit as seen from the resonator, oscillation becomes possible and a high-frequency electromagnetic field is accumulated in the resonator. At this time, for a negative resistance circuit to be seen from the resonator, the condition of positive feedback condition to the transistor amplifier must be satisfied and, moreover, the securing of weak coupling between the resonator and free space is a basic requirement.

The radiating oscillator apparatuses of FIGS. 24, 25 and 26, in which a resonator is used that also functions as an antenna, are devised to enable adjustment of the condition of positive feedback to the high-frequency transistor by adjusting the capacitance. However, the method shown in FIG. 24 of adjusting the capacitance by varying the width of the narrow gap between the two rectangular conductor patches 15 does not allow the adjustment to be made with sufficient freedom. The method shown in FIG. 25 of using chip capacitors to couple the circular conductor patches 17 is not effective in the milliwave region without modification and thus is similarly deficient in terms of freedom of adjustment. Moreover, as already mentioned, other than the ability to adjust the distance of the separation between the conductor patches and the conductor planar surface disposed under and parallel to the conductor patches, the method of FIG. 26 also lacks adjustability.

Thus, none of the methods of FIGS. 24, 25 and 26 gives consideration to the matter of securing a weakly coupled state between the conductor patches, that is, the resonator, and free space, and neither do the methods make any disclosure regarding a way of realizing a weakly coupled state between free space and the resonator. The radiating oscillator apparatuses using resonators that also function as antennas shown in FIGS. 24, 25 and 26 therefore do not disclose a method for realizing an optimum oscillation state.

FIG. 27 shows a planar configuration of a micro- and millimeter wave radiating oscillator apparatus disclosed by the present inventors (JP-A Hei 9-220579). This apparatus comprises a pair of fan-shaped conductor patches 19 disposed with their pointed portions 20 in proximity and their arcuate portions on opposite sides, a high-frequency FET 12 disposed therebetween having a gate connected to one of the fan-shaped conductor patches 19, a drain connected to the fan-shaped other conductor patch 19 and a source connected to ground, a conductor planar surface disposed parallel to the surfaces of the fan-shaped conductor patches 19 and spaced therefrom by a separation that is between one-fifteenth and one-fifth the wavelength generated therefrom. The radius of each of the fan-shaped conductor patches 19 is about one-fourth the oscillation wavelength. Each fan-shaped conductor patch 19 is connected through a direct current bias line 11 to a separate direct current power source whose source is at ground potential.

The technology disclosed by FIG. 27 is superior to the prior art technologies in that it permits adjustment of the distance of the separation between the conductor patches 19 and the conductor planar surface, and in that there is freedom of adjustment of the angle of divergence θ of the fan-shaped conductor patches 19. Similarly to the radiating oscillator apparatus described with reference to FIG. 22 whose oscillation resonator also functions as an electromagnetic wave output section that employs Fabry-Perot resonator technology, the planar conductor patches of the radiating oscillator apparatus function both as a resonator and as an electromagnetic wave extraction section, thereby securing two controllable parameters required for optimization of oscillation conditions. In addition, it was expected to provide a planar radiating oscillation apparatus suitable for realizing high-efficiency power combining by mutual spatial phase synchronization of multiple such apparatus units arranged in a planar array.

However, the move to higher frequencies leading to finer device geometries, the increase in characteristic differentials among individual high-frequency transistors, the larger degree of error in the precision with which circuits and resonators are fabricated, the growing effect of non-uniformity of materials and other such factors made radiating oscillator apparatuses more susceptible to the effects of oscillation frequency variation. Further, along with the rise in the number of oscillators used in arrays, the demands on uniformity and the coupling strength requirements became increasingly rigorous. Thus, there has been a need to develop new technologies that enable the achievement and adjustment of more wideband frequency synchronization and stronger spatial coupling.

The Gaussian beam resonator is limited in application by the size of its aperture, which is several wavelengths or more. Moreover, it is by nature a high-Q resonator and, as such, is not appropriate for use in wideband frequency modulation, multifrequency sharing and other such applications. Further, although suitable for overlaying with a planar circuit, a resonator shaped like a plano-convex lens with one side comprised by a spherical mirror is relatively high in cost. Thus, a new solution is needed with respect to lowering costs.

By utilizing configuration technology findings obtained with respect to the beam radiating oscillator apparatus that as described in the foregoing uses a Gaussian-beam resonator, the present inventors were able to realize a high-efficiency radiating oscillator apparatus employing a planar resonator formed by fan-shaped conductor patches (JP-A Hei 9-220579). In accordance with this disclosure, it is possible to achieve a high-efficiency planar radiating oscillator apparatus for micro- to millimeter wave frequencies. From the standpoint of providing a planar radiating oscillation apparatus encompassing an array of oscillator apparatuses disposed in a single plane for readily enabling spatial coupling between the radiating oscillator apparatuses and realizing mutual spatial phase synchronization, of all the prior art structures, this was the one that had the greatest potential.

As mentioned, however, the move to higher frequencies leading to finer device geometries, differences between the characteristics of individual high-frequency transistors, the degree of error in the precision with which circuits and resonators are fabricated, non-uniformity of materials and other such error factors were tending to give rise to variation in the oscillation frequencies of individual radiating oscillator apparatuses. Further, along with the rise in the number of oscillators used in arrays, the demands with respect to uniformity of characteristics and coupling strength requirements became increasingly rigorous, giving rise to the need to develop new technologies that enable the achievement and adjustment of a wider range of synchronized frequencies and stronger spatial coupling.

The prior art technologies described in the foregoing have been unable to provide a planar radiating oscillator apparatus capable of simultaneously achieving high frequency output with high efficiency, wideband characteristics from microwave to the still higher frequency milliwave region, an array-based sharp beam radiation characteristic, high output through power combining and, in order to secure an enhanced degree of freedom for adaptively responding to application requirements for active beam shaping and the like, the ability to adjust the bandwidth of synchronizable frequencies and to adjust the spatial coupling strength, if desired.

The present invention was accomplished in the light of the foregoing circumstances and has as a main object to provide a planar radiating oscillator apparatus that if required is able to realize a broader synchronized frequency bandwidth as well as a higher spatial intercoupling strength, is adjustable and enables high-frequency output to be extracted into free space at high efficiency.

Another object of the invention is to provide a planar radiating oscillator apparatus for micro- and millimeter waves that is suitable for constituting and applying an array of a plurality of oscillator apparatuses of the invention in a single plane for realizing high-efficiency power combining by mutually synchronizing the array of oscillators.

SUMMARY OF THE INVENTION

To achieve these objects, the invention provides a planar radiating oscillator apparatus comprising:

a pair of conductor patches having a common axis of symmetry and axially symmetrically uniformly sloped pointed portions that are disposed with the pointed portions in proximity and in which a distance between opposite extremities of the pair of conductor patches is equal to two-fifths to three-fifths of a wavelength of an electromagnetic wave to be generated, a high-frequency transistor disposed between and connected to the conductor patches, a conductor planar surface disposed under and parallel to the conductor patches at a separation distance of between one-fifteenth and one-fifth the generated wavelength therefrom, and at least one direct current power source connected to the conductor patches and having a ground potential in common with a source potential of the high-frequency transistor.

This invention encompasses a planar radiating oscillator apparatus constituted by arraying a plurality of oscillator apparatuses of the foregoing structure in a single plane.

The high-frequency transistor can be a field effect high-frequency transistor having a gate connected to one of the conductor patches, a drain connected to the other of the conductor patches, and a source connected to ground. Moreover, the high-frequency transistor can be a junction high-frequency transistor having a base connected to one of the conductor patches, a collector connected to the other of the conductor patches and an emitter connected to ground. The high-frequency transistor may be a high-frequency transistor constituted as a single transistor or as multiple transistors connected in parallel.

The invention encompasses the pair of conductor patches and the conductor planar surface opposed to the undersurfaces of the pair of conductor patches being provided on opposite sides of a dielectric material that exhibits small high-frequency loss such as high-purity silicon, quartz, sapphire, alumina, PTFE, and polyethylene.

In accordance with the planar radiating oscillator apparatus having the foregoing configuration, the angle of aperture of the pointed portions of the conductor patches and the shape of the conductor patches are selected to obtain oscillation at a frequency that corresponds to the half-wavelength distance between the opposite extremities of the pair of conductor patches, and to obtain high spectral purity. Although the oscillation frequency thus obtained will vary within the range of 0.8 to 1.2 times the frequency of a wave whose half wavelength is the distance between the opposite extremities of the pair of conductor patches, slightly degrading the spectral purity, wideband synchronized frequency characteristics can be achieved. Moreover, the shape of the pointed portions of the pair of conductor patches of the invention serves to suppress the generation of resonator intersecting polarization components, making it possible to obtain good-quality radiation output having few intersecting polarization components.

Also, the distance between the conductor planar surface disposed parallel to the conductor patches and the conductor patch surfaces, being between one-fifteenth and one-fifth the wavelength generated therefrom, is around 3 to 10 ten times the thickness of an ordinary strip line or of the circuit board used as a planar antenna substrate. Therefore, the pair of conductor patches do not constitute a planar antenna matched to free space at the resonant frequency, resulting in a planar resonator whose coupling with free space is weak. Moreover, disposed at the center of the pair of conductor patches is a high-frequency field effect transistor having a gate connected to one of the conductor patches, a drain connected to the other of the conductor patches and a source connected to ground, whereby a direct current bias is applied to each of the conductor patches from a grounded source to thereby form a grounded-source high-frequency amplifier. A noise signal occurring on the gate side is amplified, inducing a high-frequency current in the conductor patch connected to the drain. The high-frequency electromagnetic field thus produced is guided between the undersurface of the conductor patch and the parallel conductor surface, where it propagates in the axial direction of the conductor patch. Upon reaching the extremity of the conductor patch, most of the field is reflected and returns in the opposite direction. It then propagates back and forth through the conductor patch on the other side and is again amplified upon entering the gate of the field effect high-frequency transistor in the middle. The waveguides formed by the pair of conductor patches and the parallel conductive surface opposed to their undersurfaces form a feedback circuit of the amplifier constituted by the high-frequency transistor. In the course of this process, oscillation builds up with respect to the frequency component that matches the resonant frequency determined by the distance between the opposite extremities of the pair of conductor patches and satisfies the relationship of the feedback from the output to the input of the amplifier being in a positive feedback phase, thereby storing energy in the planar resonator formed by the pair of conductor patches.

In the steady state, part of the high-frequency energy stored in the planar resonator composed of the weakly space-coupled conductor patches and the high-frequency transistor is radiated into free space at a constant rate. Since the distance between the surfaces of the pair of conductor patches and the conductor planar surface lying parallel thereto is selected to be between one-fifteenth and one-fifth the wavelength, a planar radiating oscillator apparatus can be realized wherein matching with free space at the resonant frequency of the pair of conductor patches can be selected, and in which, by selecting the angle of divergence, width and extremity edge shape of the pair of conductor patches, the resonant frequency bandwidth can be adjusted over a wide range in addition to which the coupling strength of the planar resonator and the high-frequency amplifier can be selectively adjusted, the characteristics of the electromagnetic wave radiation pattern can be selected and, if necessary, the strength of the spatial coupling between planar radiating oscillator apparatuses arranged in the same plane can be adjusted, and the power from the externally connected direct current power sources can be output into free space as high-frequency oscillation power with high efficiency.

Moreover, in accordance with the planar radiating oscillator apparatus thus configured, individual radiating oscillator apparatuses each constituted by integrating a pair of conductor patches and a high-frequency field effect transistor operate as planar radiating oscillator apparatuses that enable power from externally connected direct current power sources to be extracted into free space as oscillation power with high efficiency. Since the multiple pairs of conductor patches are made of the same material formed to have the same shape and dimensions and the high-frequency field effect transistors midway between the respective pairs of conductor patches are of the same type and have the same characteristics, there are obtained planar radiating oscillator apparatuses with substantially the same working frequency that each operate as a high-efficiency, high-frequency oscillator apparatus. These oscillator apparatuses are arrayed in the same plane so that the output of each radiating oscillator apparatus mutually synchronizes with the outputs of the adjacent radiating oscillator apparatuses of the same type. As a result, a planar radiating overall oscillator apparatus is realized that is capable of very high-efficiency spatial power combining.

While the foregoing apparatus configuration was described with reference to the use of a field effect high-frequency transistor disposed at the center of each pair of conductor patches having a gate connected to one of the conductor patches, a drain connected to the other of the conductor patches and a source connected to ground, instead of a field effect high-frequency transistor, a junction high-frequency transistor can be used having a base connected to one of the conductor patches, a collector connected to the other of the conductor patches and an emitter connected to ground. This would make it possible to take advantage of the characteristics of a junction high-frequency transistor to fabricate a low-noise planar radiating oscillator apparatus or a planar radiating oscillator apparatus capable of high-efficiency spatial power combining.

The high-frequency transistor disposed between the paired conductor patches may be constituted as two or more high-frequency transistors connected in parallel, in which case the saturation power becomes greater than in the case of a single high-frequency transistor by a factor equal to the number of transistors connected in parallel or at maximum by a factor equal to the square of the number of transistors connected in parallel. This greatly increases the saturation power of the resonator and, as such, enables high-frequency generation to build up to the state of enabling accumulation of a large amount of energy in the resonator, thereby enabling the realization of a planar radiating oscillator apparatus exhibiting high spectral purity and large output.

The above and other features of the present invention will become apparent from the following description made with reference to the drawings.

DESCRIPTION OF THE PREFERRED EMBODIMENTS

Embodiments of the oscillator apparatus according to the present invention will now be described in detail with reference to the drawings. However, it is to be understood that the invention is not limited thereto.

The present invention is the result of research conducted with the aim of achieving a planar radiating oscillator apparatus exhibiting good wideband synchronization frequency characteristics and strong spatial intercoupling, and that enables the extraction of high-frequency oscillation power as spatial output with good efficiency. It was accomplished by further developing the radiating oscillator apparatus technology illustrated by FIG. 27, utilizing the basic characteristics thereof to achieve high-efficiency radiation oscillation output. At the same time, the oscillator apparatus of the invention accomplishes what was hitherto impossible by (1) enabling adjustment of the synchronous frequency bands, and (2) enabling adjustment of the electromagnetic wave radiation patterns, to thereby make possible the adjustment, as required, the strength of the spatial intercoupling effected with respect to a plurality of planar radiating oscillator apparatuses arrayed in a single plane. The adjustment function capabilities of the planar radiating oscillator apparatus according to the invention can be applied to high-efficiency spatial power combining technology for the achievement of high output in the micro- and millimeter wave regions, and to active antenna beam control technologies.

Figure 1:
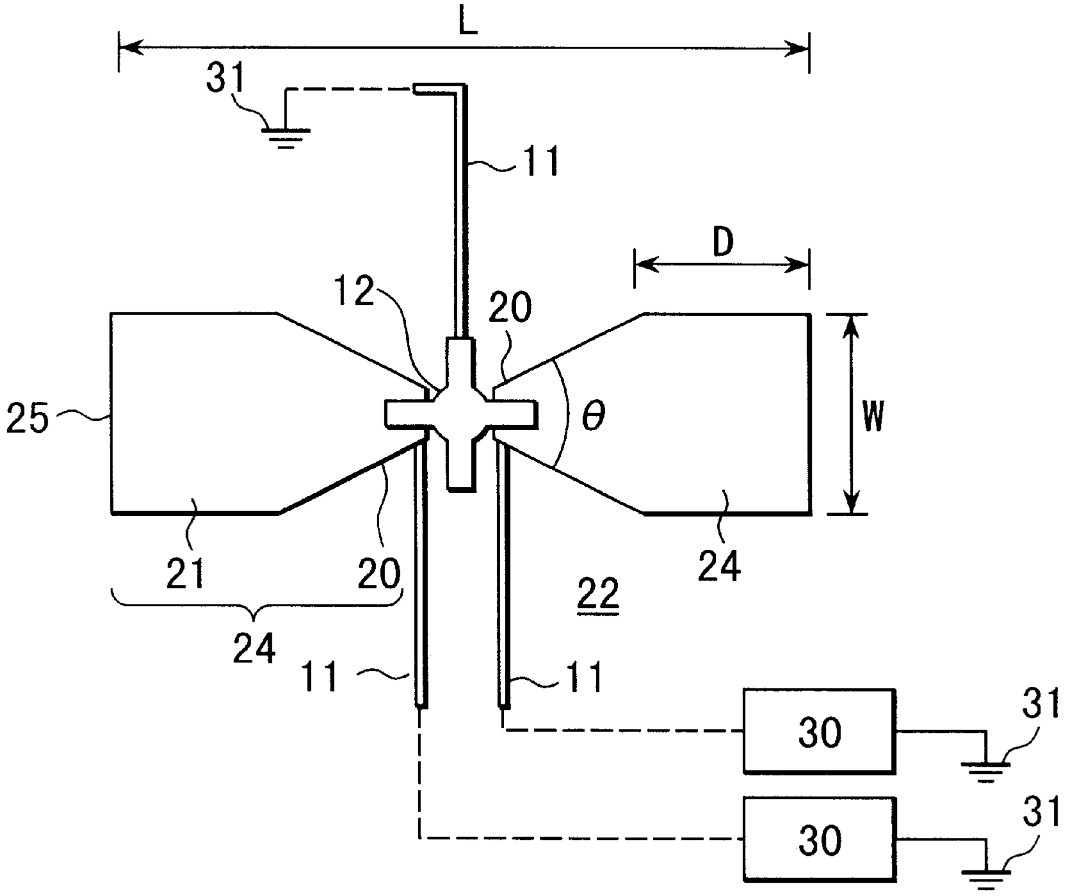
FIG. 1 is an explanatory diagram of a first embodiment of the planar radiating oscillator apparatus according to the invention.
Figure 2:
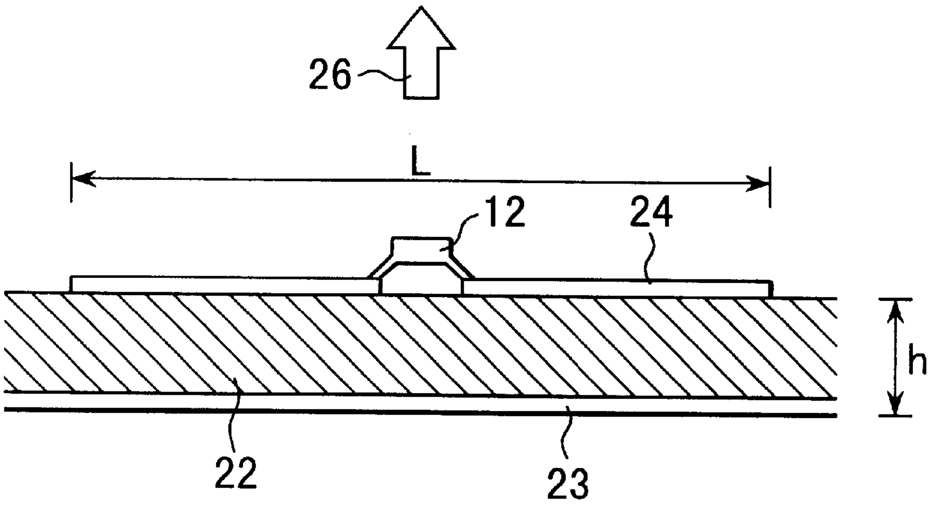
FIG. 2 is a cross-sectional view of the oscillator apparatus of FIG. 1.

FIG. 1 is an explanatory diagram of a first embodiment of the planar radiating oscillator apparatus according to the invention, and FIG. 2 is a cross-sectional view of the oscillator apparatus of FIG. 1. With reference to the drawings, each of a pair of conductor patches 24 has a main portion 21 and an axially symmetrically uniformly sloped pointed portion 20 parallel thereto. The pair of conductor patches 24 are disposed with the pointed portions 20 in proximity and the conductor patches 24 sharing a common axis of symmetry. Between the conductor patches 24, there is disposed a high-frequency transistor 12 constituted by a high-frequency field effect transistor (FET) having a gate connected to one of the conductor patches 24, a drain connected to the other conductor patch 24 and a source of the high-frequency transistor 12 connected to ground 31. A conductor planar surface 23 is disposed under and parallel to the pair of conductor patches 24 and separated therefrom by a distance h that is set to be between one-fifteenth and one-fifth the wavelength generated therefrom. The symbol L denotes the distance between the opposite extremities of the pair of conductor patches 24, and W is the width and D the length of each main portion 21. Each of the conductor patches 24 is connected through a direct current bias line 11 to a separate direct current power source 30 whose ground is common with the grounded source of the high-frequency transistor 12. Through tests, it has been confirmed that disposing the conductor patches 24 with the pointed portions 20 thereof separated by a distance equivalent to one-fortieth to one-sixth the generated oscillation wavelength enables a stable state of oscillation to be obtained. FIG. 2 shows an embodiment in which a low-loss dielectric substrate 22 is sandwiched between the conductor patches 24 and the conductor planar surface 23. In practice, it is effective for the pair of conductor patches and the conductor planar surface opposed to the undersurfaces of the pair of conductor patches to be provided on opposite sides of a dielectric material that exhibits small high-frequency loss such as high-purity silicon, quartz, sapphire, alumina, PTFE, and polyethylene.

The paired conductor patches 24 that in the planar radiating oscillator apparatus according to this invention function as both an oscillation resonator and as a radiator for radiating accumulated electromagnetic energy into free space, are each provided with an axially symmetrical, uniformly sloped pointed portion 20. The shape of the pointed portions is an important element of the invention. Tests conducted with respect to the fan-shaped conductor patches 19 of the prior art shown in FIG. 27 and to shape-modified versions thereof revealed that the adjustment of the angle of divergence θ of the pointed portions 20 that in the planar radiating oscillator apparatus of the present invention, shown in FIGS. 1 and 2, are placed in proximity of the high-frequency transistor 12 disposed therebetween affects the strength of the coupling between the high-frequency transistor 12 and the resonator, and as such is an important element determining the oscillation conditions. The tests also revealed that employing conductor patches having a shape that spreads out from the pointed portions 20 is highly effective for suppressing cross-polarization components. Along with the adjustment of the angle of divergence θ of the conductor patches 24, the ability to be able to appropriately select the distance L between the opposite extremities of the pair of conductor patches 24, and the width W and length D of each main portion 21 thereof, provides a degree of freedom in the selection of the conditions required to set the oscillation conditions. While the distance L between the opposite extremities of the pair of conductor patches 24 is substantially equal to half the oscillation wavelength, this can be varied from two-fifths to three-fifths the wavelength depending on the shape of the edge 25 of the main portion 21 of the conductor patches 24. Similarly, adjustment of the width W of the main portion 21 allows a variation within the range of one-eighth to one-half wavelength, and adjustment of the length D of the main portion 21 allows a variation within the range of zero to one-fourth wavelength.

Figure 3:
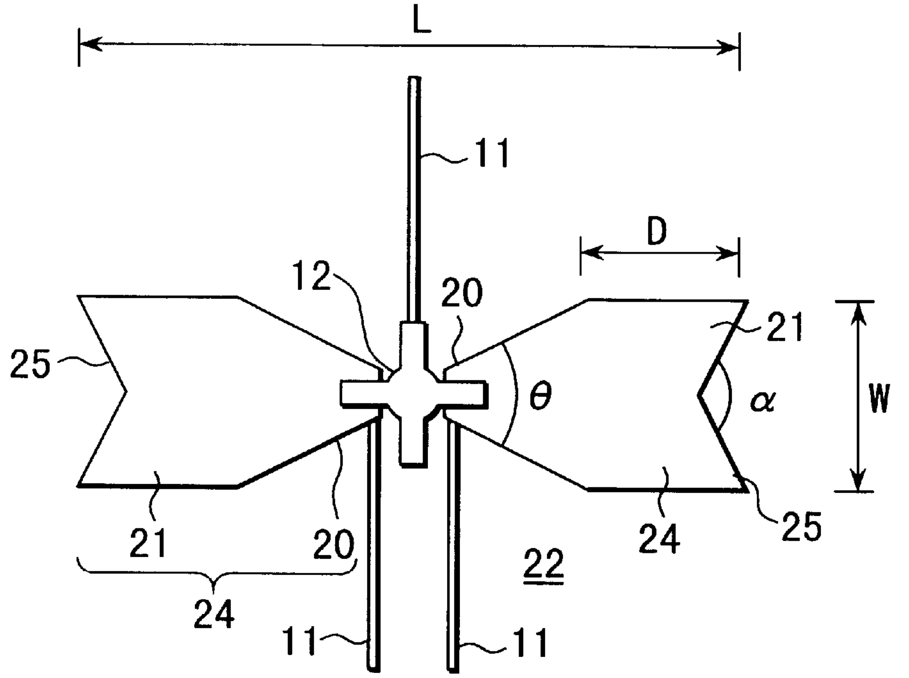
FIG. 3 is an explanatory diagram of a second embodiment of the planar radiating oscillator apparatus according to the invention.

FIG. 3 is an explanatory diagram of the planar radiating oscillator apparatus according to a second embodiment of the invention. In this case, the edge 25 of each of the main portions 21 of the conductor patches 24 has a straight cutout portion that expands the resonant frequency band. A practical range for the angle of divergence α of the cutout portion is 90 degrees$\leqq\alpha\leqq$27 degrees. Similarly to the foregoing description, the oscillation center frequency varies according to the shape of the cutout portion of each edge 25. That is, the center frequency depends on the angle α. This makes it possible to obtain a planar radiating oscillator apparatus able to simultaneously generate electromagnetic waves over a wide range of synchronized frequencies. This planar radiating oscillator apparatus of the second embodiment can be regarded as equivalent to that of the first embodiment shown in FIG. 1 being given an angle of divergence α of 180 degrees. The electromagnetic wave radiation pattern characteristic in a direction that is ±90 degrees with respect to the strength of the spatial intercoupling between planar radiating oscillator apparatuses of the invention arrayed in a single plane depends mainly on the width W of the main portions 21 of the paired conductor patches 24, and on the angle of divergence θ of the pointed portions 20.

Figure 4:
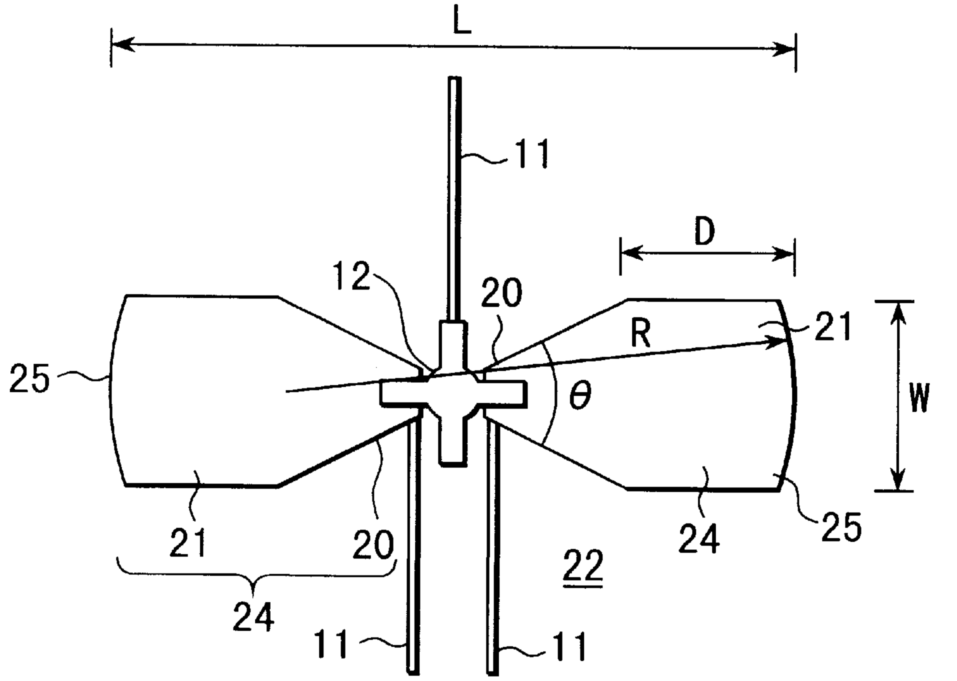
FIG. 4 is an explanatory diagram of a third embodiment of the planar radiating oscillator apparatus according to the invention.
Figure 5:
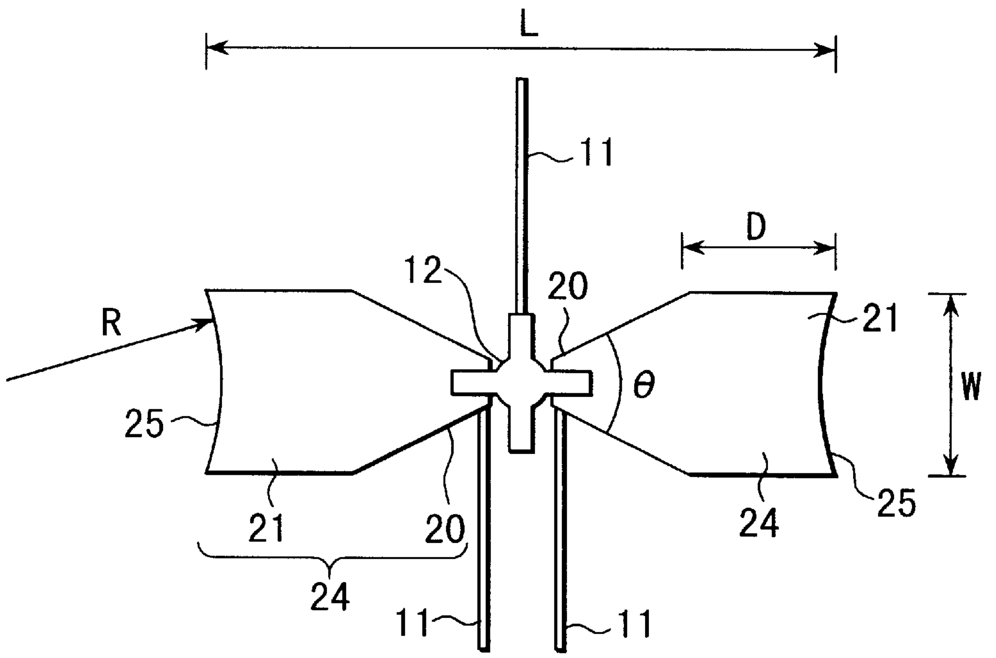
FIG. 5 is an explanatory diagram of a fourth embodiment of the planar radiating oscillator apparatus according to the invention.

FIGS. 4 and 5 are explanatory diagrams of third and fourth embodiments, respectively, of the planar radiating oscillator apparatus according to the invention. In the planar radiating oscillator apparatus shown in FIG. 4, the edge 25 of each main portion 21 is shaped to have an outward curvature. While this has the effect of narrowing the resonant frequency band, thereby decreasing the synchronous frequency bandwidth, it does enhance the spectral purity. In contrast, in the planar radiating oscillator apparatus shown in FIG. 5 the edge 25 of each main portion 21 has a concave curvature, which provides a broader resonant frequency band, and therefore a wider synchronous frequency bandwidth, although at some cost in terms of spectral purity.

Figure 27:
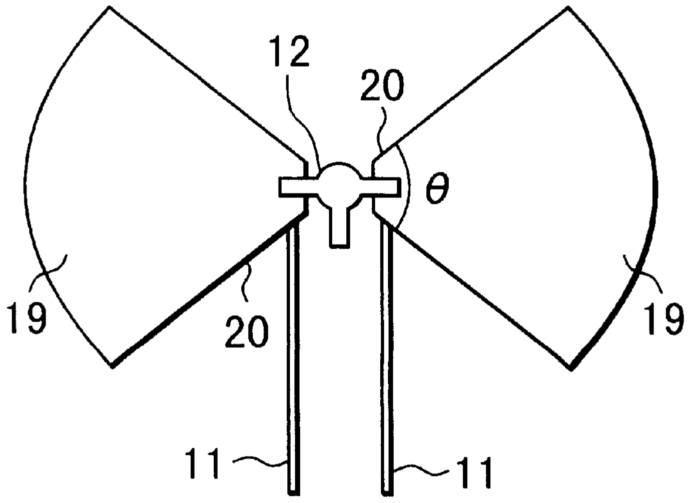
FIG. 27 (PRIOR ART)
FIG. 27 is an explanatory diagram illustrating an example of a prior art radiating oscillator apparatus configuration in which a pair of fan-shaped conductor patches serve both as a resonator and as an electromagnetic wave radiator.

The radius of curvature R of the curved edges 25 of the conductor patches 24 shown in FIG. 4 is close to half the edge-to-edge distance L, and when the main portion 21 has a short length D the shape of the conductor patches 24 of the planar radiating oscillator apparatus becomes close to that of the fan-shaped conductor patches of FIG. 27. The result is a considerable narrowing of the resonant frequency band, so that although the spectral purity is enhanced, the synchronous frequency band is very limited. It should be understood that the addition of some asymmetry to the shape of the paired conductor patches of the planar radiating oscillator apparatus does not produce much change in terms of function.

Figure 6:
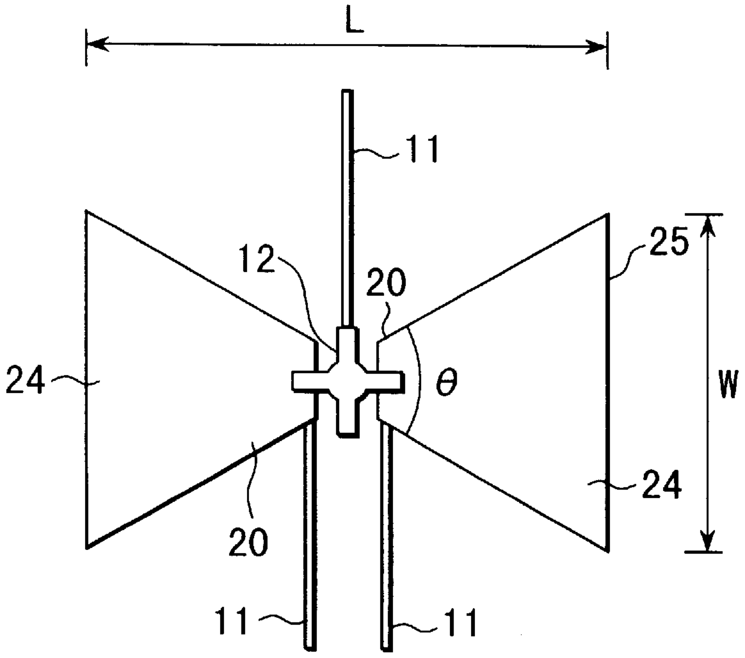
FIG. 6 is an explanatory diagram of a specific implementation of the oscillator apparatus of FIG. 1.

FIG. 6 is an explanatory diagram of a specific implementation of the oscillator apparatus of FIG. 1. In this embodiment the conductor patches are comprised of just the pointed portions 20, with no main portion 21 (D=0). This increases the resonant frequency bandwidth of the electromagnetic waves generated, thereby also increasing the synchronous frequency bandwidth, but at the cost of a lower spectral purity. In this embodiment each conductor patch 24 is connected through a direct current bias line 11 to a separate direct current power source 30 whose ground is common with the grounded source of the high-frequency transistor 12.

Figure 7:
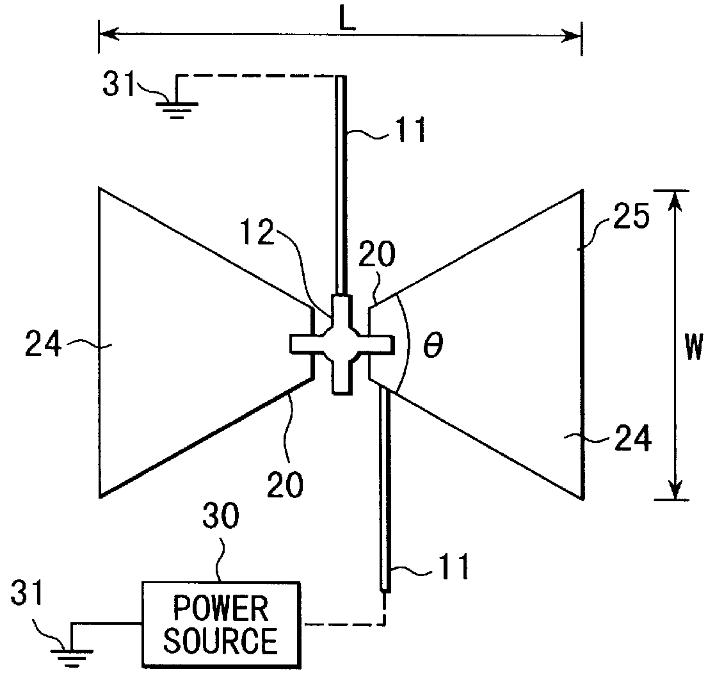
FIG. 7 is an explanatory diagram of a modification of the oscillator apparatus shown in FIG. 6.

The configuration of FIG. 7 is similar to that of FIG. 6 except that the gate is not biased and a single direct current power source 30 supplies a bias across the drain and the source. There is no difference in basic oscillation function whichever the bias system used. When a plurality of planar radiating oscillator apparatuses are arrayed in a single plane for synchronized operation, the biasing arrangement of FIG. 7 has the advantage of being simpler in terms of the wiring.

Figure 8:
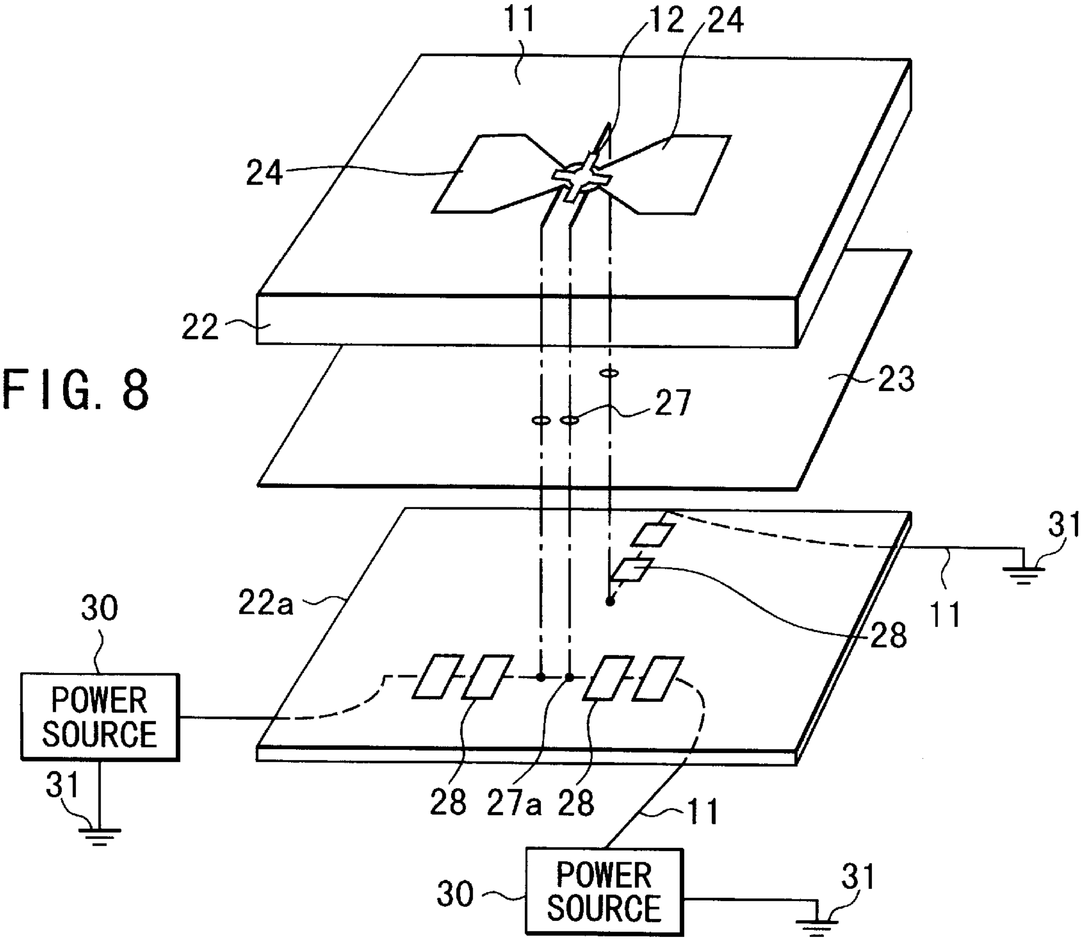
FIG. 8 is an exploded perspective view of the oscillator apparatus of FIG. 1.

FIG. 8 is an exploded perspective view of the planar radiating oscillator apparatus of the first embodiment shown in FIG. 1. Here, the planar radiating oscillator apparatus comprises a pair of conductor patches 24 having a common axis of symmetry, and pointed portions 20 disposed in mutual proximity. In the middle, there is a high-frequency field effect transistor (FET) 12 having a gate connected to one of the conductor patches 24, a drain connected to the other conductor patch 24 and a source connected to ground 31. A conductor planar surface 23 is disposed parallel to the pair of conductor patches 24 and separated therefrom by a distance that is determined by a dielectric substrate 22. The source of the high-frequency FET 12 is connected to ground 31 via a hole 27 in the conductor planar surface 23, a hole **27*a* in a lower dielectric substrate layer 22*a* and a choke filter 28 formed on the undersurface thereof. The gate and drain are each connected to a separate direct current power source 30 whose ground is common with the grounded source of the high-frequency transistor 12. In the conductor patches 24 of the planar radiating oscillator apparatuses of FIGS. 1 to 7, whether the change in width from the pointed portion 20 to the edge 25** is in the form of a straight or curved line does not result in any major difference in the characteristics of the planar radiating oscillator apparatus concerned.

Figure 9:
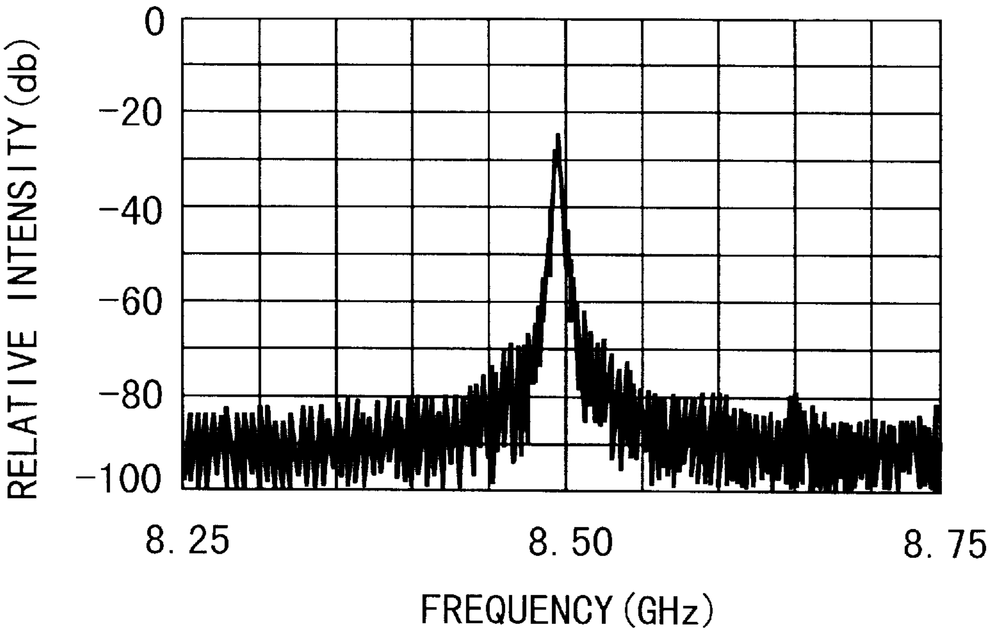
FIG. 9 is a graph of the oscillation spectrum produced by the oscillator apparatus of FIG. 4.
Figure 10:
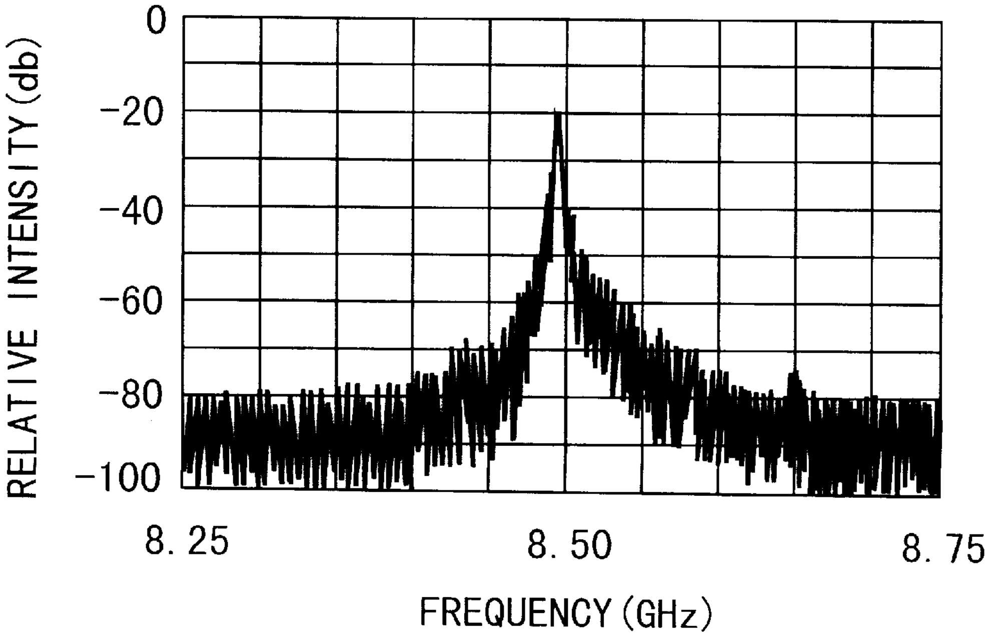
FIG. 10 is a graph of the oscillation spectrum produced by another configuration of the oscillator apparatus shown in FIG. 6.
Figure 11:
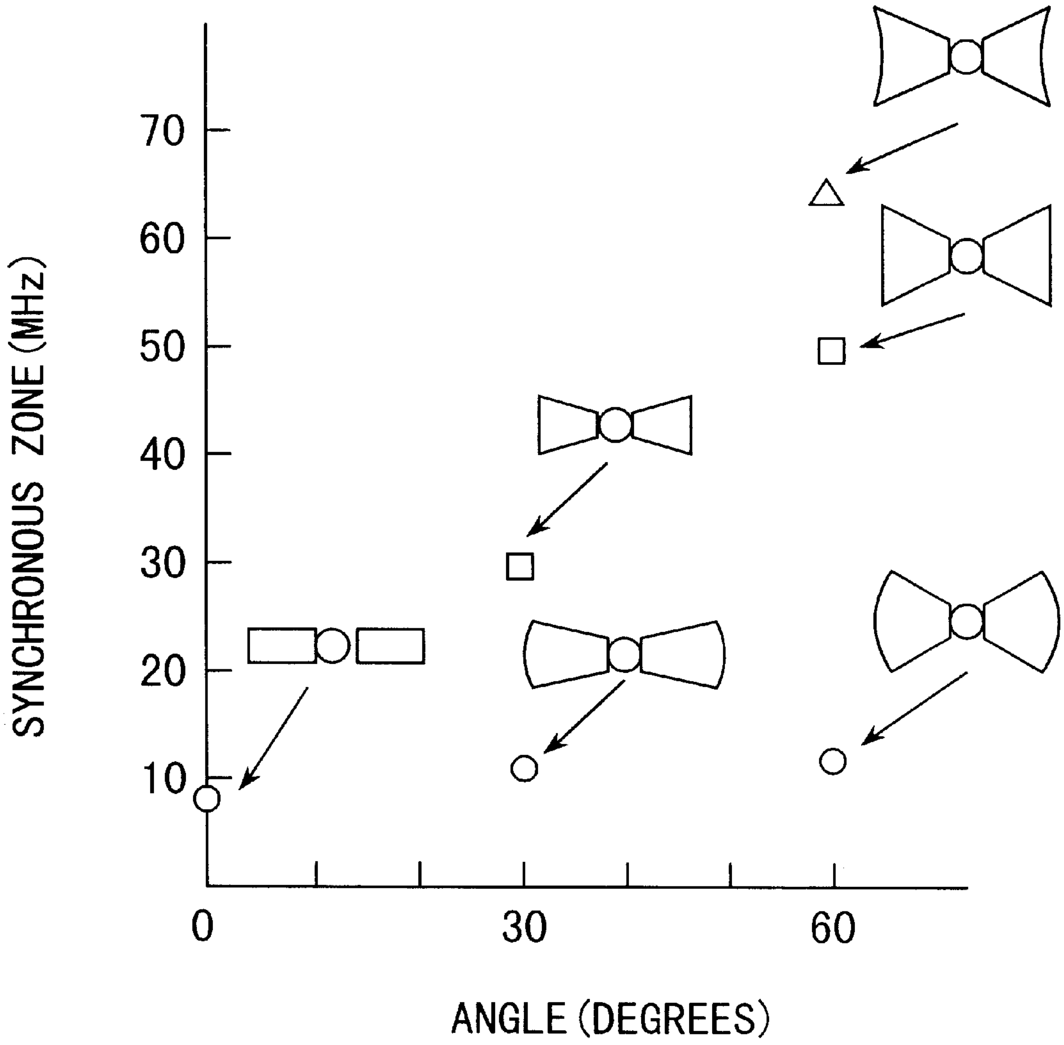
FIG. 11 is a graph illustrating the synchronous frequency characteristic for different angles of divergence θ of the pointed portion of the conductor patches in the oscillator apparatus according to the invention.

FIGS. 9 and 10 are graphs of the oscillation spectra produced by two different configurations of the planar radiating oscillator apparatus of the invention. Specifically, FIG. 9 shows an oscillation spectrum of an oscillation apparatus with conductor patches 24 having the shape shown in FIG. 4 which produces a narrow resonant frequency band. In contrast, FIG. 10 shows an oscillation spectrum of an oscillation apparatus with conductor patches 24 having the shape shown in FIG. 6 which produces a wide resonant frequency band. The spectrum of FIG. 10 exhibits a lower spectral purity than that of FIG. 9. FIG. 11 is a graph showing synchronous frequency bands measured in respect of a planar radiating oscillator apparatus having the inventive conductor patch configuration of FIG. 1 with no main portion 21, and with pointed portions having an angle of divergence θ of 30 degrees and 60 degrees. For comparison, the graph also shows the results obtained in respect of a planar radiating oscillator apparatus using the prior art fan-shaped conductor patches of FIG. 27, measured in the case of the pointed portions having an angle of divergence θ of zero degrees, 30 degrees and 60 degrees. In the tests used to obtain these results, the radiation was maintained at a constant level while varying the radiation frequency to measure the extent by which oscillation frequency could synchronize with the changes, which is shown as the relative bandwidth of the synchronous frequency band.

As revealed by FIG. 11, in the case of the oscillator apparatus using the prior art fan-shaped conductor patches of FIG. 27, changing the angle of divergence θ did not produce any major observable change in the width of the synchronous band (○ symbol). However, in the case of the oscillator apparatus of the present invention, with pointed portions 20 with an angle of divergence θ of 30 degrees the synchronous frequency band was about 30 MHz, and about 50 MHz at 60 degrees (□ symbol), increasing to over 60 MHz when the conductor patches used had concave edges (Δ symbol). This clearly showed the wide extent by which the synchronous frequency band could be adjusted by varying the shape of the conductor patches used.

Figure 12:
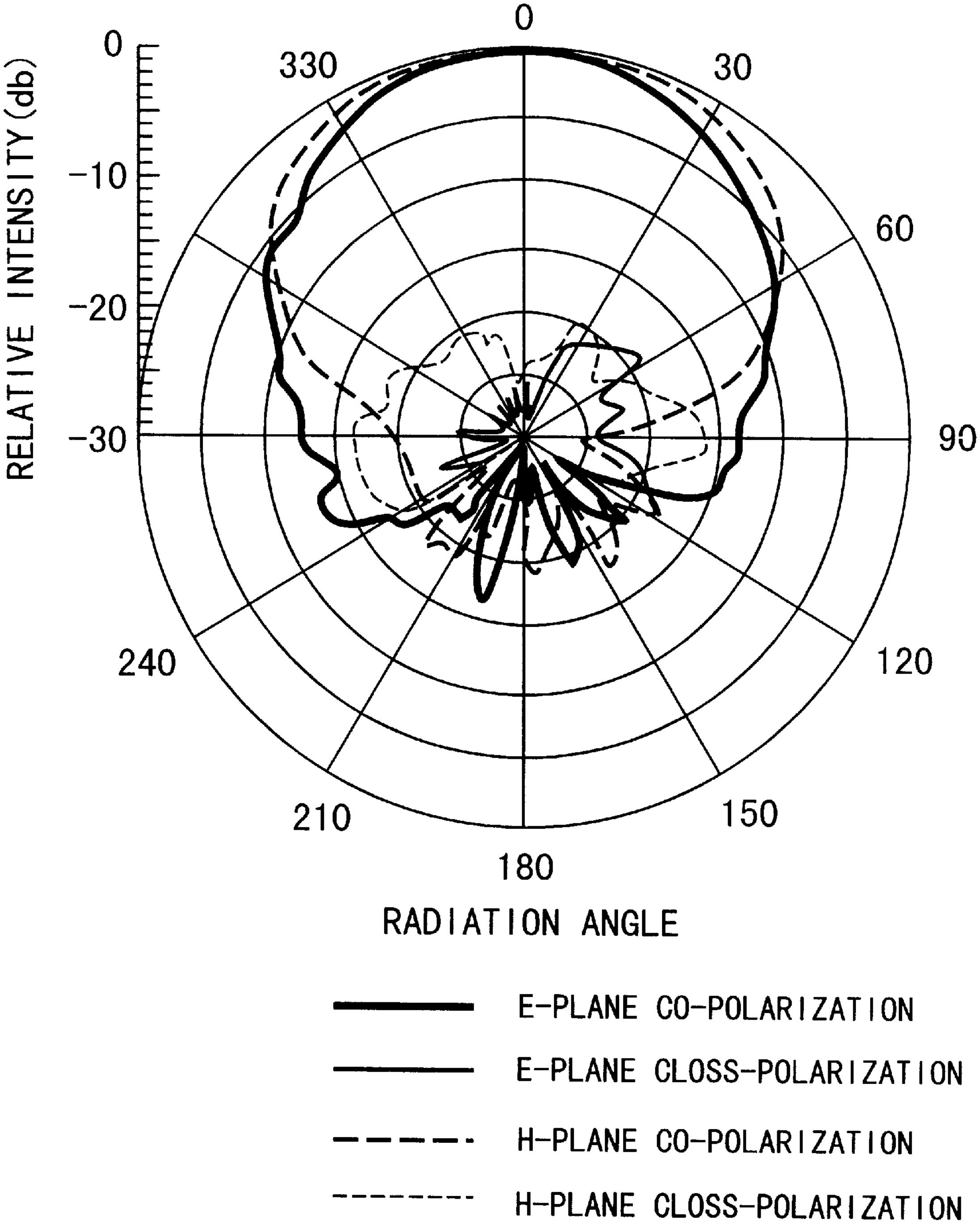
FIG. 12 shows an electromagnetic wave radiation pattern characteristic in a planar radiating oscillator apparatus according to one embodiment of the invention.
Figure 13:
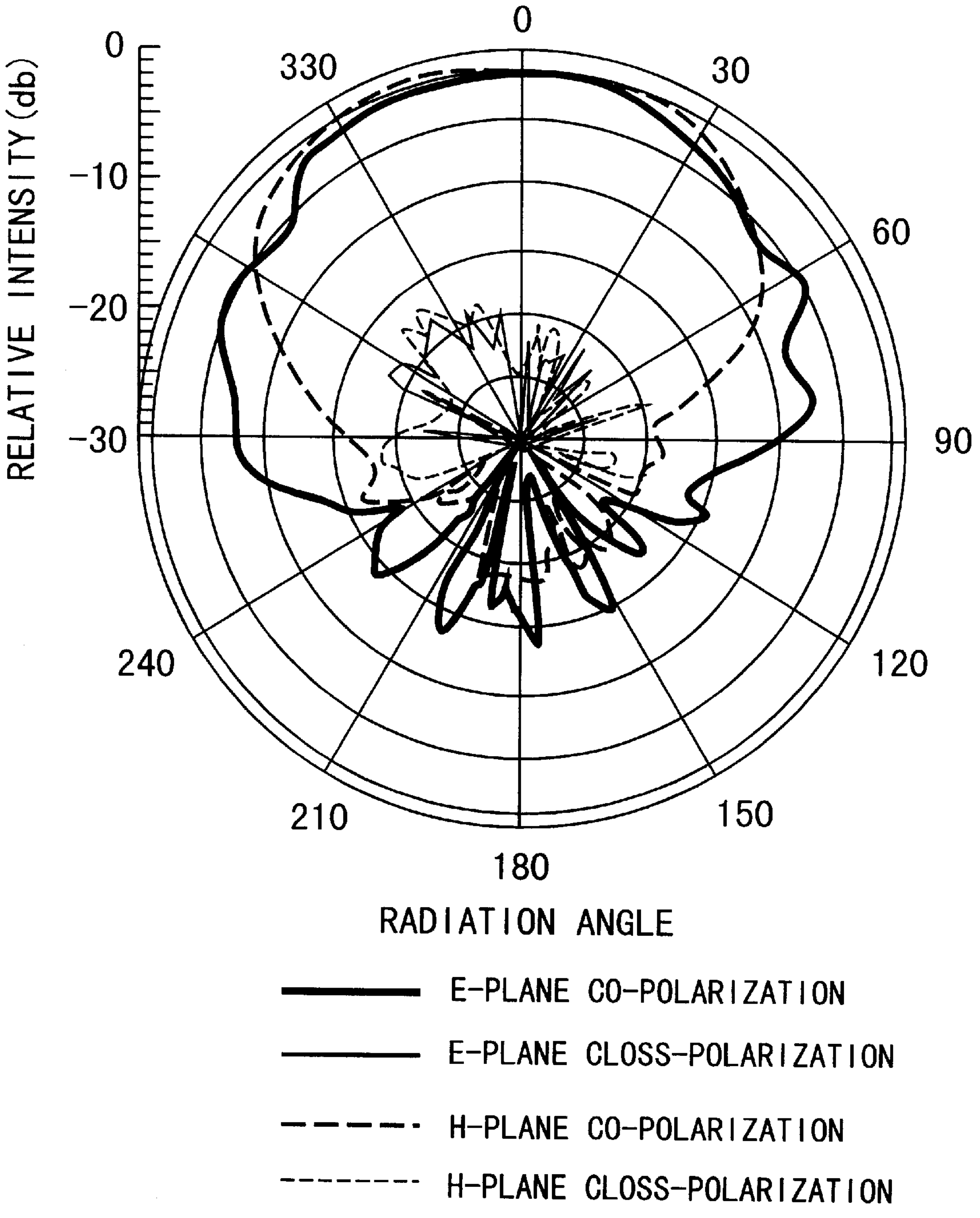
FIG. 13 shows an electromagnetic wave radiation pattern characteristic in a planar radiating oscillator apparatus according to another embodiment of the invention.

FIG. 12 shows the radiation pattern characteristic of an oscillator apparatus having the conductor patches 24 with the curved edges 25 shown in FIG. 4, corresponding to the high spectral purity shown in FIG. 9. FIG. 13 shows the radiation pattern characteristic of an oscillator apparatus having the paired conductor patches 24 with the square-cut edges 25 shown in FIG. 6, corresponding to the low spectral purity shown in FIG. 10. As can be seen from FIGS. 12 and 13, the planar radiating oscillator apparatus using the paired conductor patches according to the present invention keeps the generation of intersecting polarization components to a low level. In FIGS. 12 and 13, also, differences in the shape of the conductor patches used in the planar radiating oscillator apparatus of the invention gave rise in the E plane to significant observable differences in the radiation level in a direction parallel to the conductor plane of the planar radiating oscillator apparatus. This difference produces a difference in the spatial intercoupling strength between multiple planar radiating oscillator apparatuses arrayed in a single plane.

Figure 14:
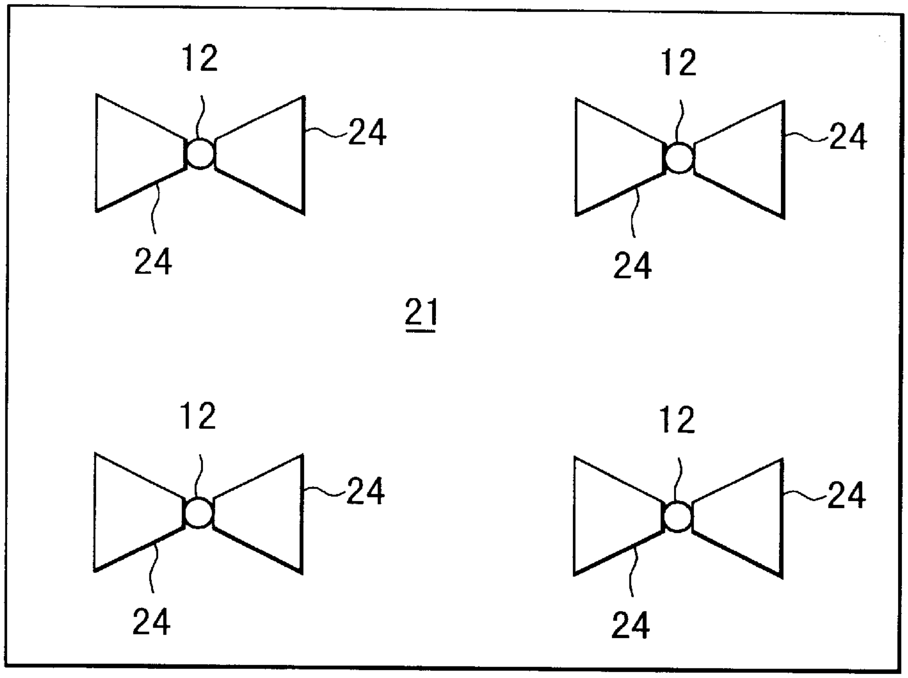
FIG. 14 is an explanatory diagram illustrating the concept of a planar radiating oscillator apparatus according to an embodiment of the invention in which the apparatus is comprised as a plurality of planar radiating oscillator apparatuses arrayed on the same plane.
Figure 15:
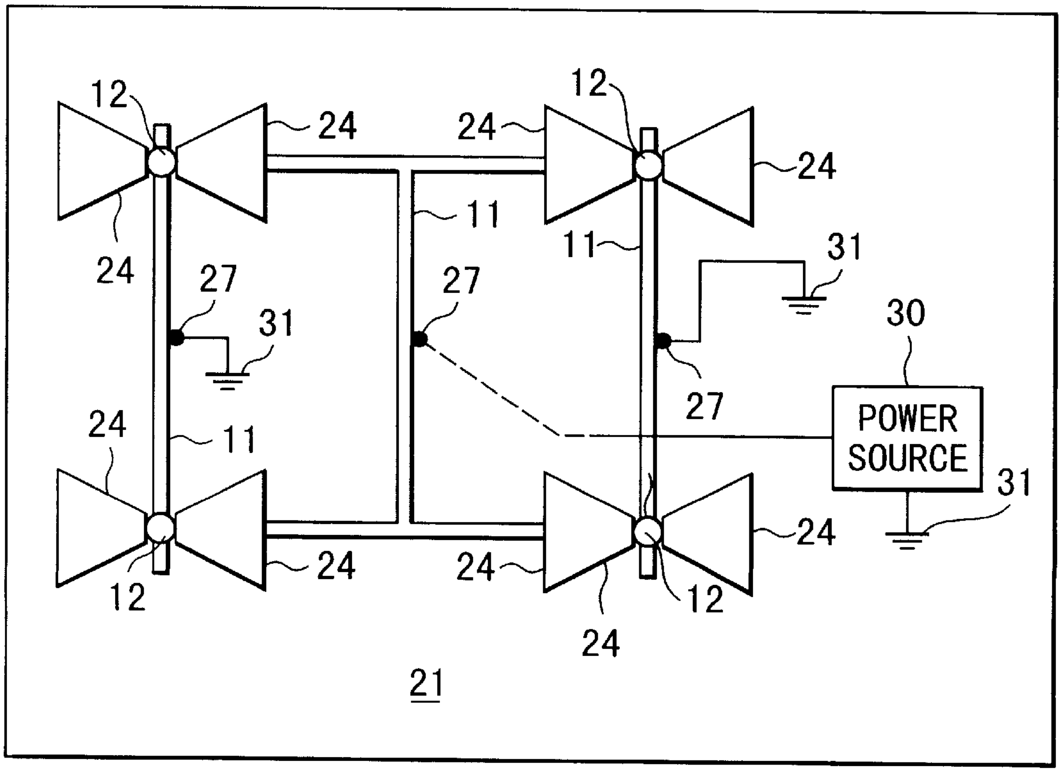
FIG. 15 is an explanatory diagram illustrating the concept of a planar radiating oscillator apparatus according to another embodiment of the invention in which the apparatus is comprised as a plurality of planar radiating oscillator apparatuses arrayed on the same plane.

FIG. 14 illustrates the structure of a two-dimensional array of four of the inventive planar radiating oscillator apparatuses arranged in a single plane. FIG. 15 is also a four-element array, shown using the no-gate-bias biasing wiring arrangement of FIG. 7. An extremely simple bias wiring arrangement is used to enable a single direct current power source 30 to drive four planar radiating oscillator apparatuses. To connect to the direct current power source 30, the direct current bias line 11 passes through a hole 27 and a choke filter disposed on the underside.

Figure 16:
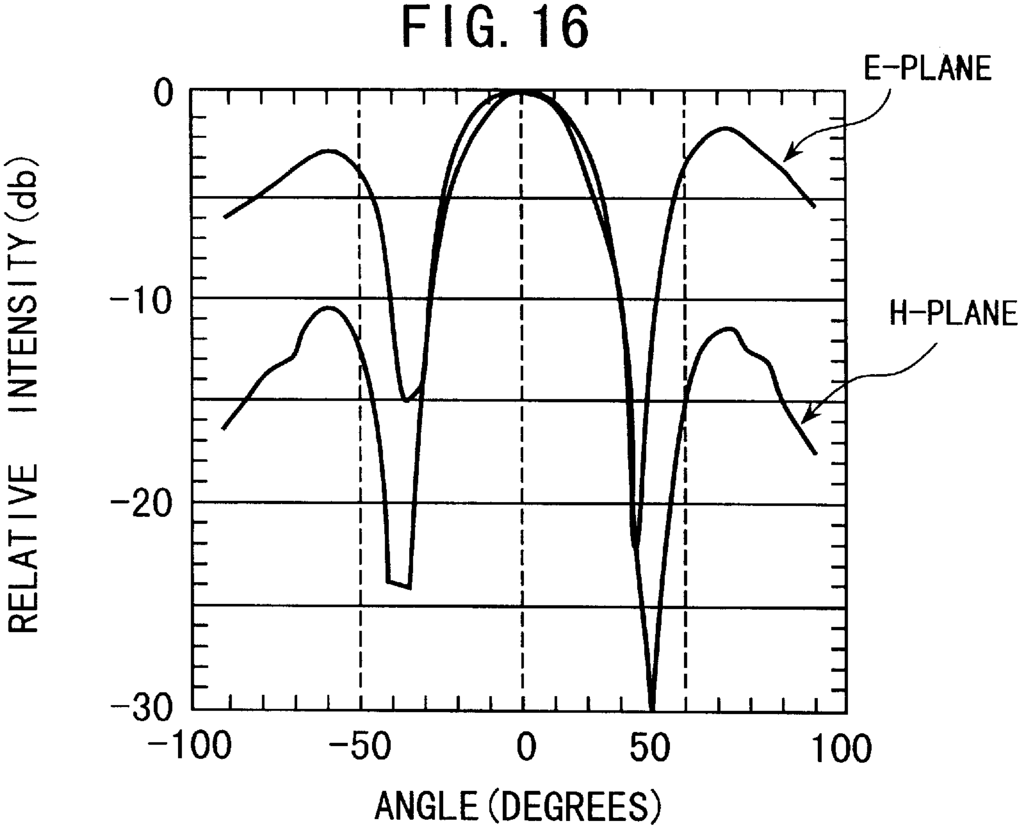
FIG. 16 is a graph illustrating the electromagnetic wave radiation pattern characteristic of a planar radiating oscillator apparatus according to the invention comprising four planar radiating oscillator apparatuses arrayed on the same plane.

FIG. 16 is a graph illustrating the radiation pattern characteristic of a planar radiating oscillator apparatus comprised of four oscillator apparatuses according to the invention arrayed on the same plane. The measurement of the planar radiating oscillator apparatus constituted as a four-element array was conducted in an anechoic chamber. The beam output oscillator apparatus being tested was set as a transmitting antenna on a rotary stage and the angular dependence of the received power of a transmitted signal from a horn antenna was measured while changing the angle. FIG. 16 shows an example of the measurement results of the beam output radiation pattern at 8.5 GHz, with the vertical axis representing relative intensity and the horizontal axis rotational angle. The received power in the forward direction of the oscillator apparatus constituted as a four-element array was around four times the received power in the forward direction of a single-element oscillator apparatus. This shows that the parallel operation of the planar radiating oscillator apparatuses arrayed on the same plane is not simply an incrementation of the power of each element, but the manifestation of the mutually synchronized effect of the arrayed elements and the achievement of high-efficiency spatial power combining. Thus, this demonstrates the potential of a planar radiating oscillator apparatus constituted as a multi-element array to function as a high-efficiency, high-power signal source.

While the foregoing apparatus configuration was described with reference to the use of a field effect high-frequency transistor 12 disposed at the center of each pair of conductor patches having a gate connected to one of the conductor patches, a drain connected to the other of the conductor patches and a source connected to ground, instead of a field effect high-frequency transistor, a junction high-frequency transistor can be used having a base connected to one of the conductor patches, a collector connected to the other conductor patch and an emitter connected to ground. In principle, this would enable the same amplification functions to be obtained. Specifically, there can be used as the high-frequency transistor a field effect transistor such as a high electron mobility transistor (HEMT), a MESFET transistor, a MOS transistor or a junction FET or a junction transistor such as a bipolar transistor or a heterobipolar transistor (HBT). Substrate materials that can be used for forming the conductor patches of the planar radiating oscillator apparatus according to the invention include such dielectric substrate materials exhibiting small high-frequency loss as high-purity silicon, quartz, sapphire, alumina, PTFE and polyethylene.

Moreover, multiple such high-frequency transistors can be disposed in parallel connection midway between the conductor patches. With such an arrangement, the saturation power becomes greater than in the case of a single high-frequency transistor by at least a factor equal to the number of transistors connected in parallel or at maximum by a factor equal to the square of the number of transistors connected in parallel. This greatly increases the saturation power of the resonator and, as such, enables high-frequency generation to build up to the state of enabling accumulation of a large amount of energy in the resonator. This can also be used to realize a planar radiating oscillator apparatus exhibiting high spectral purity and large high-frequency output.

Figure 17:
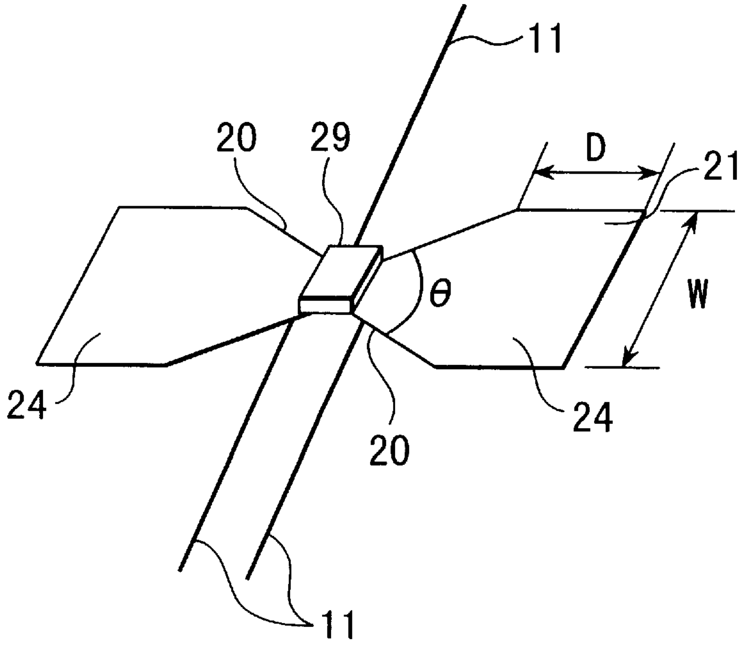
FIG. 17 is an explanatory diagram illustrating the configuration of a planar radiating oscillator apparatus according to the invention in which a high-frequency transistor chip is connected between the pair of conductor patches.
Figure 18:
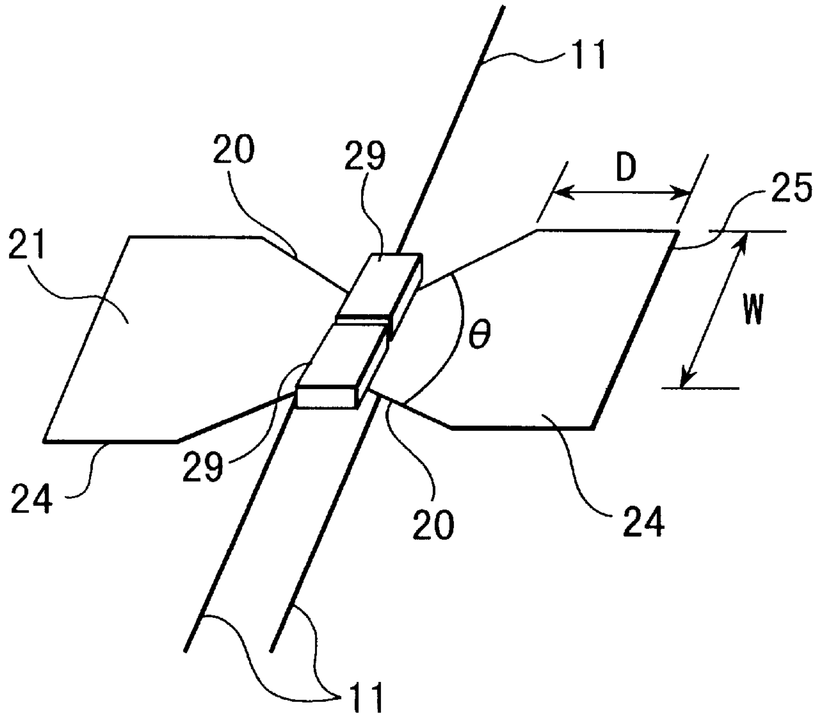
FIG. 18 is an explanatory diagram illustrating the configuration of a planar radiating oscillator apparatus according to the invention in which two high-frequency transistor chips are connected between the pair of conductor patches.
Figure 19:
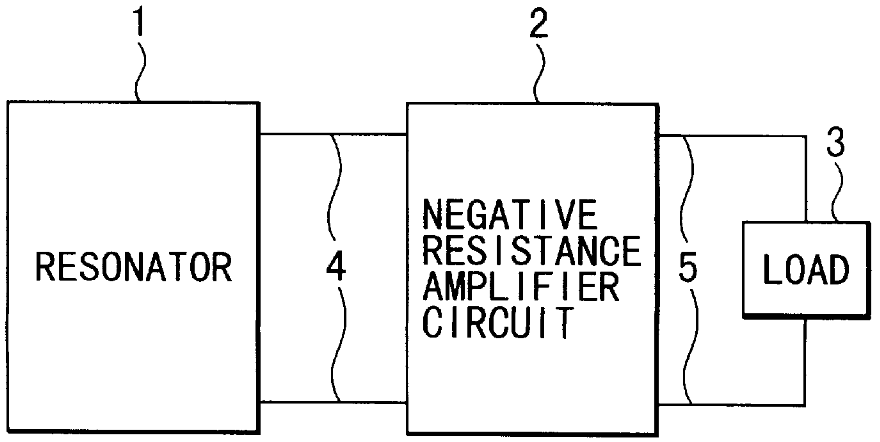
FIG. 19 (PRIOR ART)
FIG. 19 is an explanatory diagram illustrating the concept of a prior art high-frequency oscillator apparatus.
Figure 20:
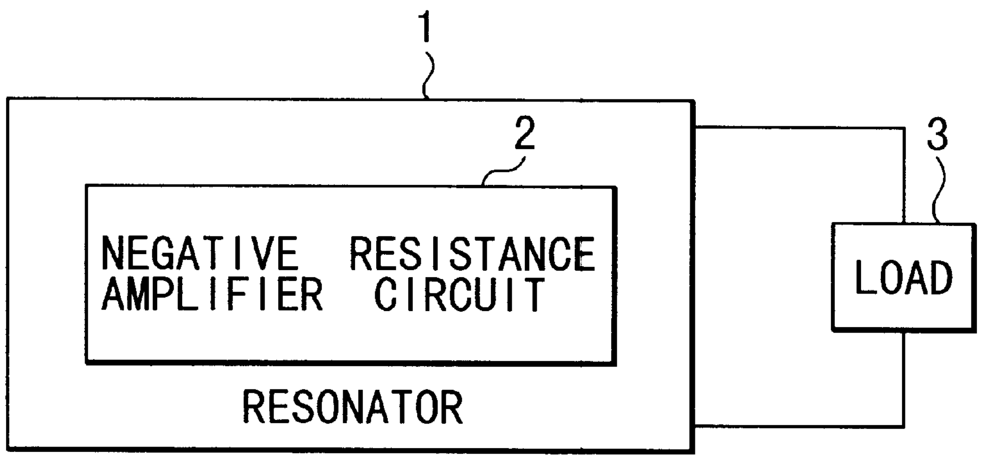
FIG. 20 (PRIOR ART)
FIG. 20 is an explanatory diagram illustrating the concept of the configuration of a prior art oscillator apparatus in which the resonator also functions as an electromagnetic wave output section.
Figure 21:
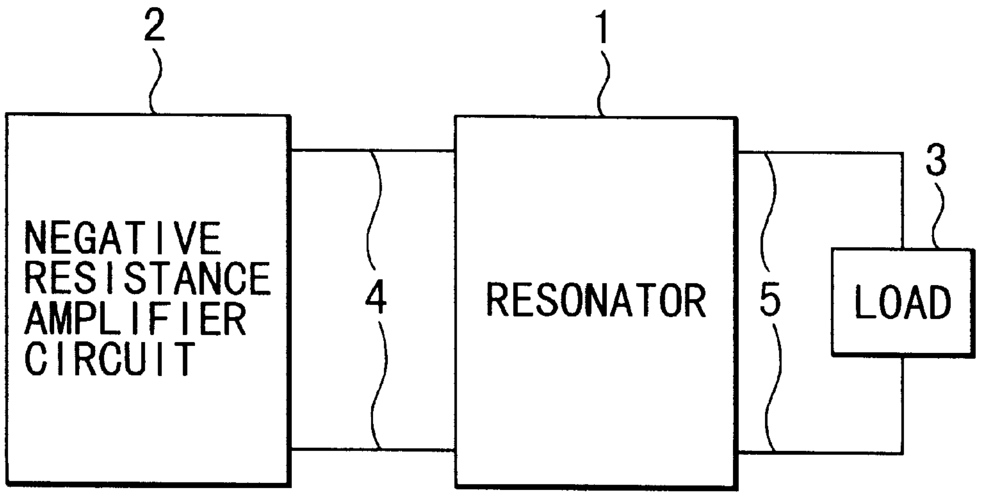
FIG. 21 (PRIOR ART)
FIG. 21 is an explanatory diagram illustrating the configuration concept of another prior art oscillator apparatus in which the resonator also functions as an electromagnetic wave output section.
Figure 22:
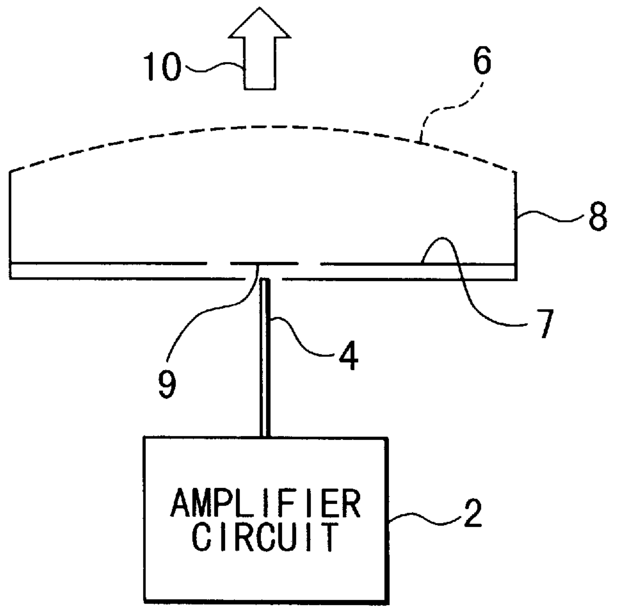
FIG. 22 (PRIOR ART)
FIG. 22 is an explanatory diagram illustrating the configuration concept of a prior art beam output oscillator apparatus.
Figure 23:
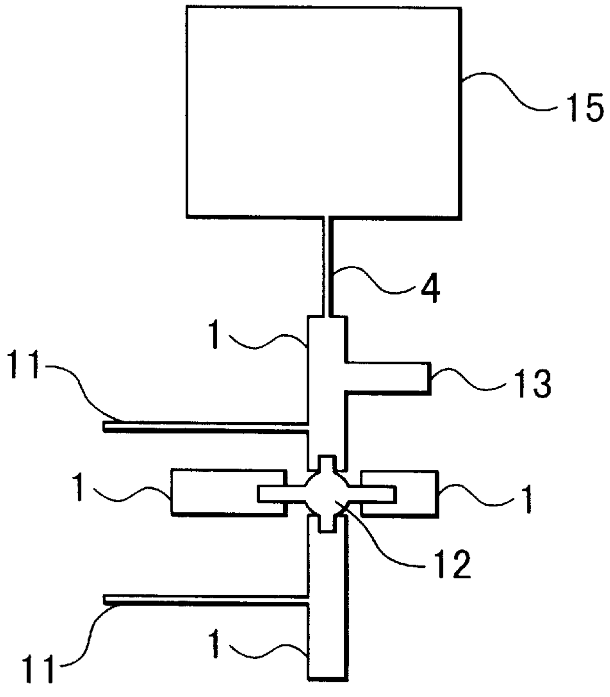
FIG. 23 (PRIOR ART)
FIG. 23 is an explanatory diagram illustrating the configuration of a prior art oscillator apparatus having a negative resistance amplifier circuit and an antenna element disposed adjacently in the same plane.
Figure 24:
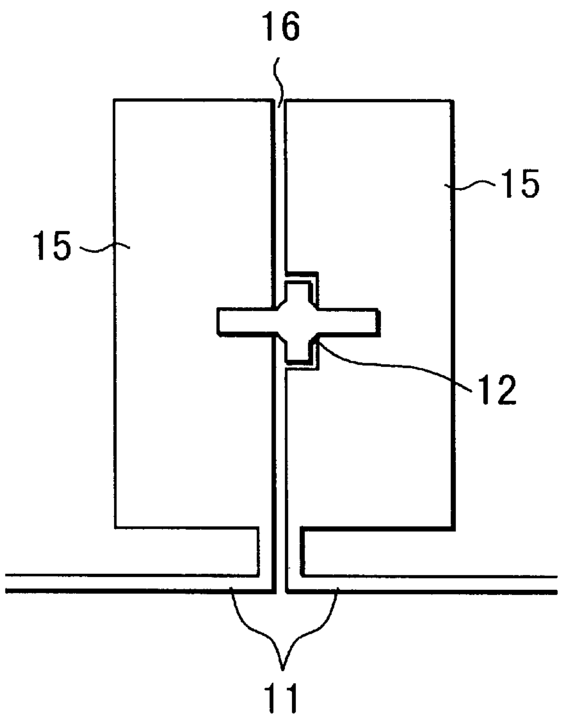
FIG. 24 (PRIOR ART)
FIG. 24 is an explanatory diagram illustrating an example of a prior art radiating oscillator apparatus configuration in which the planar conductor patches serve both as a resonator and as an electromagnetic wave radiator.
Figure 25:
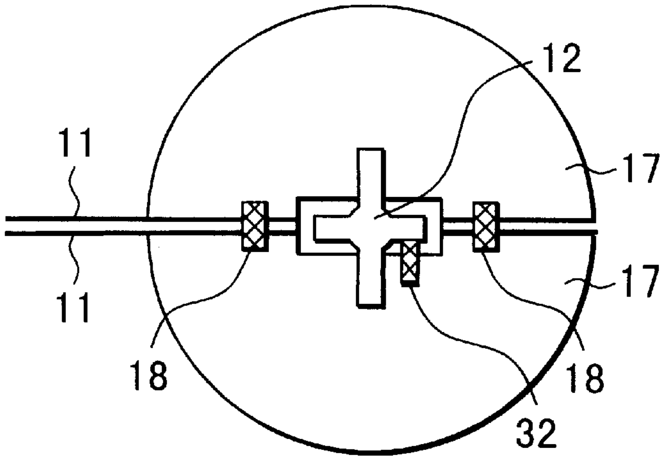
FIG. 25 (PRIOR ART)
FIG. 25 is an explanatory diagram illustrating another example of a prior art radiating oscillator apparatus configuration in which the planar conductor patches serve both as a resonator and as an electromagnetic wave radiator.
Figure 26:
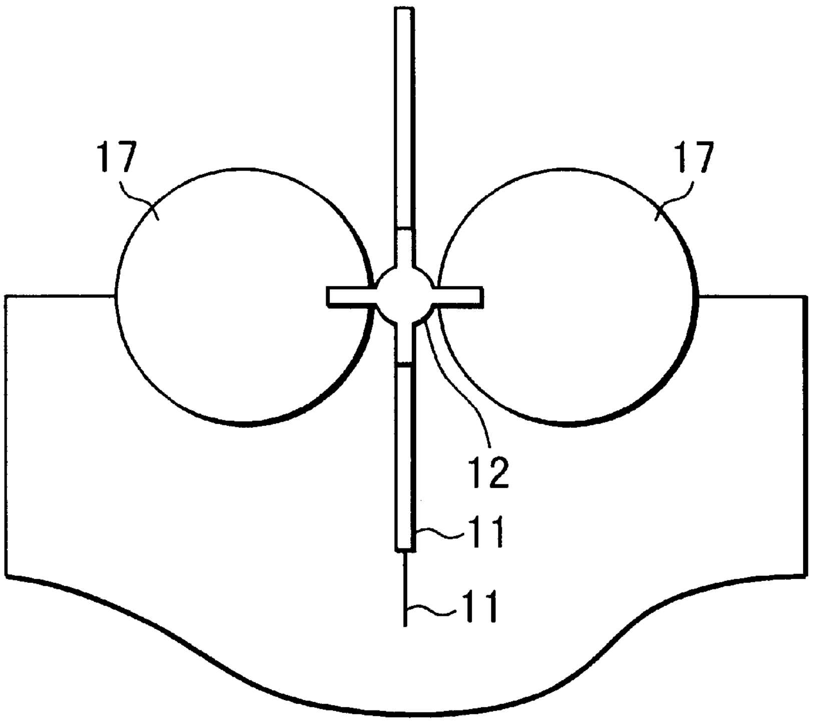
FIG. 26 (PRIOR ART)
FIG. 26 is an explanatory diagram illustrating yet another example of a prior art radiating oscillator apparatus configuration in which the planar conductor patches serve both as a resonator and as an electromagnetic wave radiator.

FIG. 17 shows the configuration of a planar radiating oscillator apparatus according to the invention in which, instead of the high-frequency transistor 12 shown in FIG. 1, the high-frequency transistor chip 29 is connected between the pointed portions 20 of the conductor patches 24 by using a flip-chip method. FIG. 18 also shows a planar radiating oscillator apparatus according to the invention in which, instead of the high-frequency transistor 12 shown in FIG. 1, two high-frequency transistor chips 29 are connected in parallel between the pointed portions 20 of the conductor patches 24.

In accordance with the planar radiating oscillator apparatus of the invention, the distance between the conductor planar surface disposed parallel to the conductor patches and the conductor patch surfaces is around 3 to 10 ten times the thickness of an ordinary strip line or of the circuit board used as a planar antenna substrate. Therefore, the pair of conductor patches do not constitute a planar antenna matched to free space at the resonant frequency, resulting in a planar resonator whose coupling with free space is weak. By selectively setting the conductor patch substrate thickness in this range and by selectively adjusting the angle of divergence of the pointed portions and the shape of the conductor patches, the impedance matching and the feedback condition of the amplifier can be controlled to realize the conditions required for optimization as a radiating oscillator apparatus whose planar conductor patches function both as an oscillator resonator and as an electromagnetic wave output section. By enabling high-frequency power generation efficiency and structural simplicity not obtainable with the prior art, this invention provides the high degree of freedom in laying out element arrays required for spatial power combining and, as such, can be expected to contribute to the advance of spatial combining by multi-element arrays, multi-element array beaming and numerous other technologies. The invention has promising applications in satellite and other millimeter wave mobile communication technology, radar technology and a wide range of technical fields requiring high output.

What is claimed is:

1. A planar radiating oscillator apparatus comprising:

a pair of conductor patches having a common axis of symmetry and axially symmetrically uniformly sloped pointed portions that are disposed with the pointed portions in proximity and in which a distance between opposite extremities of the pair of conductor patches is equal to two-fifths to three-fifths of a wavelength of an electromagnetic wave to be generated, a high-frequency transistor disposed between and connected to the conductor patches, a conductor planar surface disposed under and parallel to the conductor patches at a separation distance of between one-fifteenth and one-fifth the generated wavelength therefrom, and at least one direct current power source connected to the conductor patches and having a ground potential in common with a source potential of the high-frequency transistor.

2. A planar radiating oscillator apparatus according to claim 1 comprised as a plurality of planar radiating oscillator apparatuses arrayed on a single plane.

3. A planar radiating oscillator apparatus according to claim 1, wherein the high-frequency transistor is a field effect high-frequency transistor having a gate connected to one of the conductor patches, a drain connected to the other of the conductor patches, and a source connected to ground.

4. A planar radiating oscillator apparatus according to claim 1, wherein the high-frequency transistor is a junction high-frequency transistor having a base connected to one of the conductor patches, a collector connected to the other of the conductor patches and an emitter connected to ground.

5. A planar radiating oscillator apparatus according to claim 1, wherein the high-frequency transistor is multiple high-frequency transistors connected in parallel.

6. A planar radiating oscillator apparatus according to claim 1, wherein the pair of conductor patches and the conductor planar surface disposed under and parallel to the conductor patches are provided on opposite sides of a dielectric substrate that exhibits low high-frequency loss.

7. A planar radiating oscillator apparatus according to claim 6, wherein the dielectric substrate is composed of one selected from high-purity silicon, quartz, sapphire, alumina, PTFE, and polyethylene.

* * * * *